United States Patent
Yamamoto et al.

(10) Patent No.: US 7,838,894 B2
(45) Date of Patent: Nov. 23, 2010

(54) OPTICAL DEVICE HAVING PHOTOELECTRIC CONVERSION LAYER

(75) Inventors: Kazushige Yamamoto, Yokohama (JP); Tatsuo Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 610 days.

(21) Appl. No.: 11/845,412

(22) Filed: Aug. 27, 2007

(65) Prior Publication Data

US 2008/0079022 A1    Apr. 3, 2008

(30) Foreign Application Priority Data

Sep. 29, 2006    (JP) .............................. 2006-270003

(51) Int. Cl.
*H01L 33/00* (2010.01)
(52) U.S. Cl. ......................................... 257/98; 257/103
(58) Field of Classification Search ........... 257/88–103, 257/431–448, E33.072
See application file for complete search history.

(56) References Cited

U.S. PATENT DOCUMENTS 6,639,292 B2 * 10/2003 Yagi ........................... 257/440
2007/0145394 A1    6/2007 Shimizu et al.
2007/0152234 A1    7/2007 Yamamoto et al.
2009/0289270 A1 * 11/2009 Hanawa et al. ................. 257/98

FOREIGN PATENT DOCUMENTS

JP    2005-530360    10/2005

OTHER PUBLICATIONS

U.S. Appl. No. 12/617,104, filed Nov. 12, 2009, Yamamoto, et al.
U.S. Appl. No. 12/409,693, filed Mar. 24, 2009, Yamamoto, et al.
U.S. Appl. No. 11/837,932, filed Aug. 13, 2007, Tatsuo Shimizu, et al.
U.S. Appl. No. 11/688,595, filed Mar. 20, 2007, Kazushige Yamamoto, et al.
U.S. Appl. No. 12/207,178, filed Sep. 9, 2008, Yamamoto, et al.

* cited by examiner

*Primary Examiner*—Cuong Q Nguyen
(74) *Attorney, Agent, or Firm*—Oblon, Spivak, McClelland, Maier & Neustadt, L.L.P.

(57) ABSTRACT

An optical device has a photoelectric conversion layer that is formed of a tetrahedral bonded semiconductor, including germanium atoms as main components. A substrate has a lattice constant that is smaller than that of germanium. The plane direction of the substrate is a {111} face. A semiconductor lattice extends in the direction of a <111> axis vertical to the face of the substrate.

13 Claims, 13 Drawing Sheets

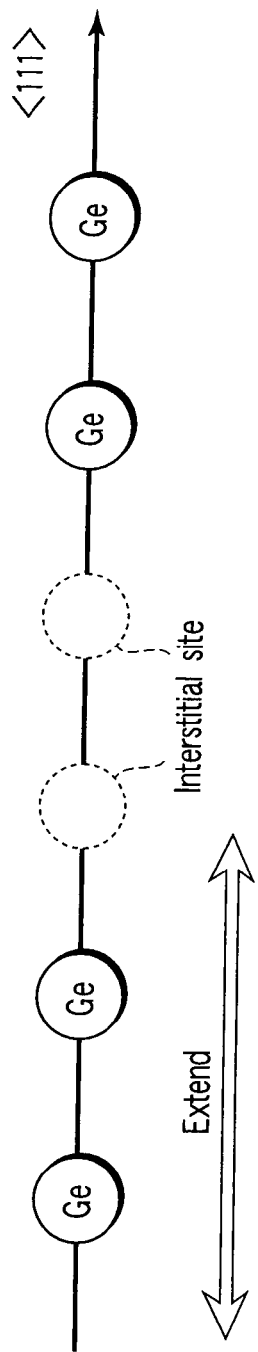
F I G. 4A
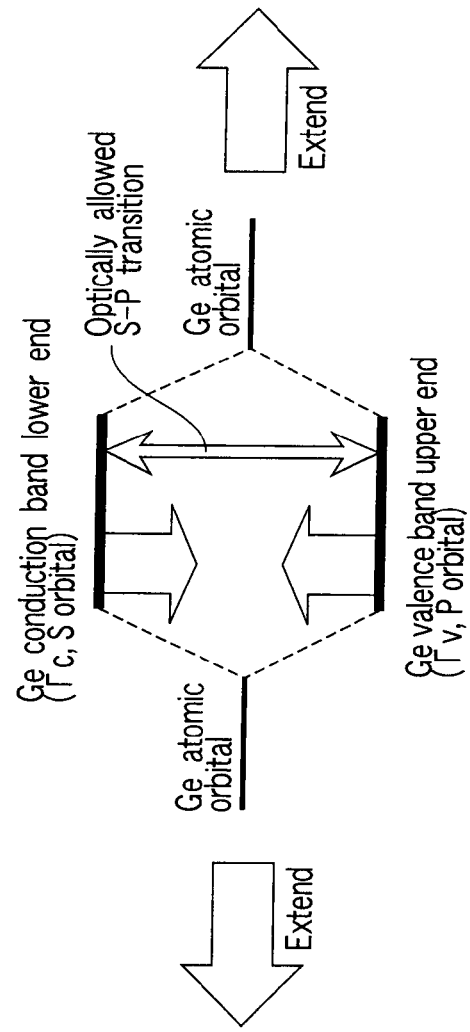
F I G. 4B

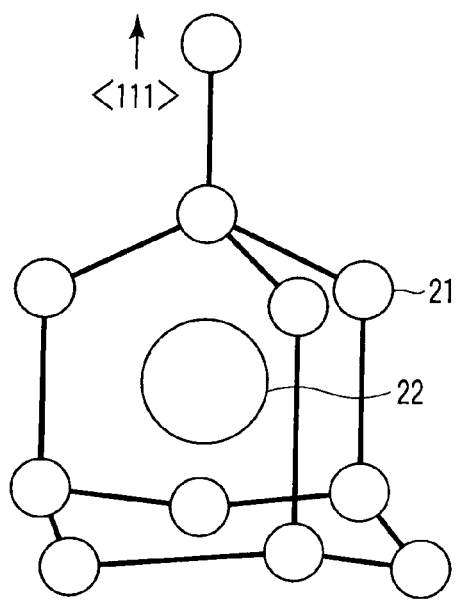
F I G. 5A
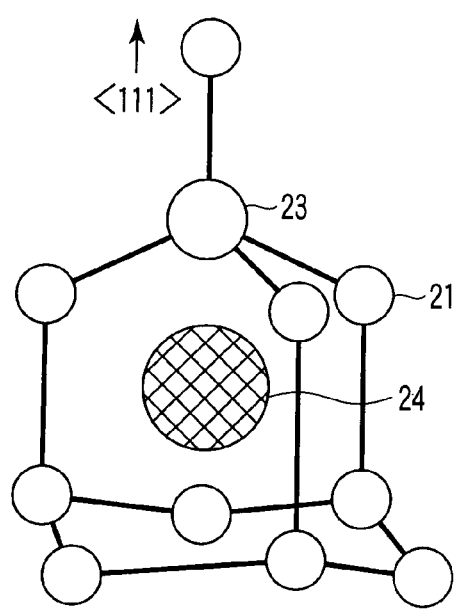
F I G. 5B

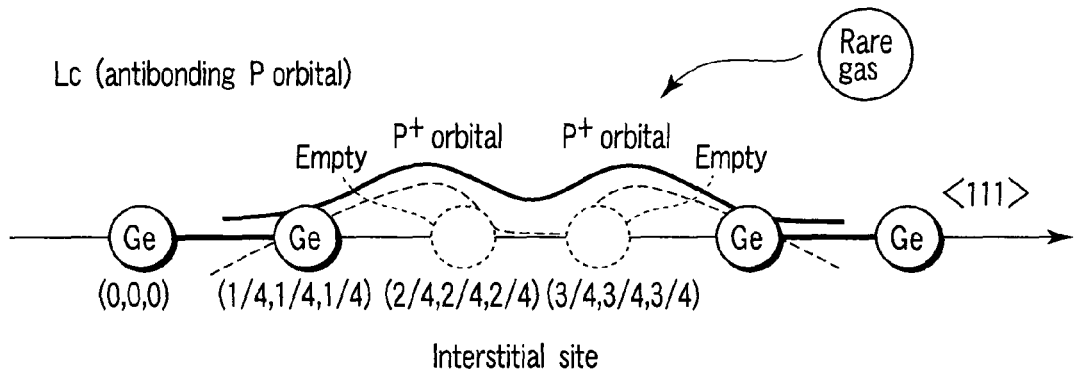
F I G. 6A
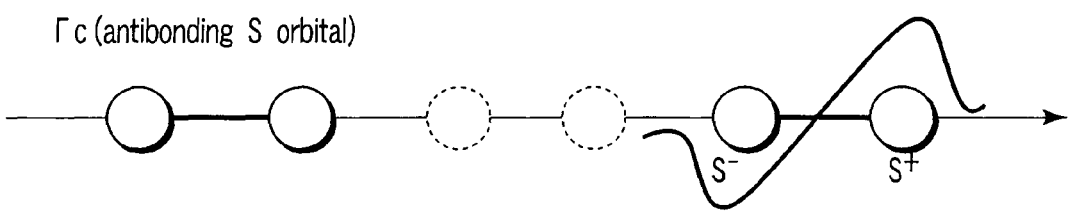
F I G. 6B
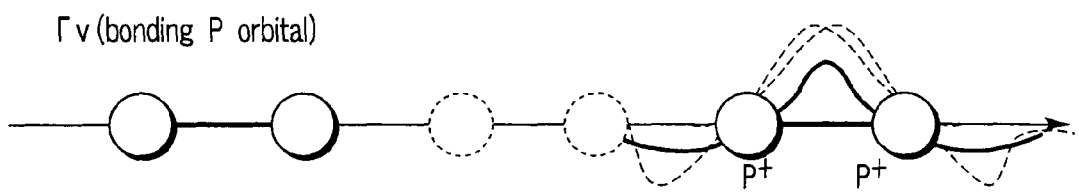
F I G. 6C

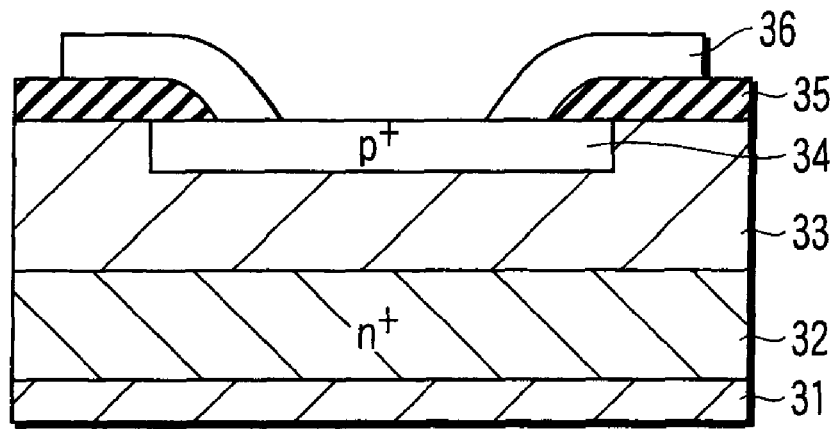
F I G. 8A
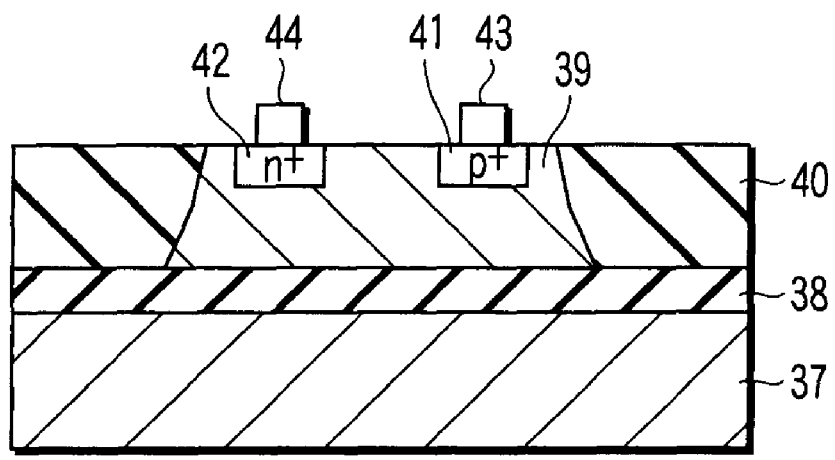
F I G. 8B

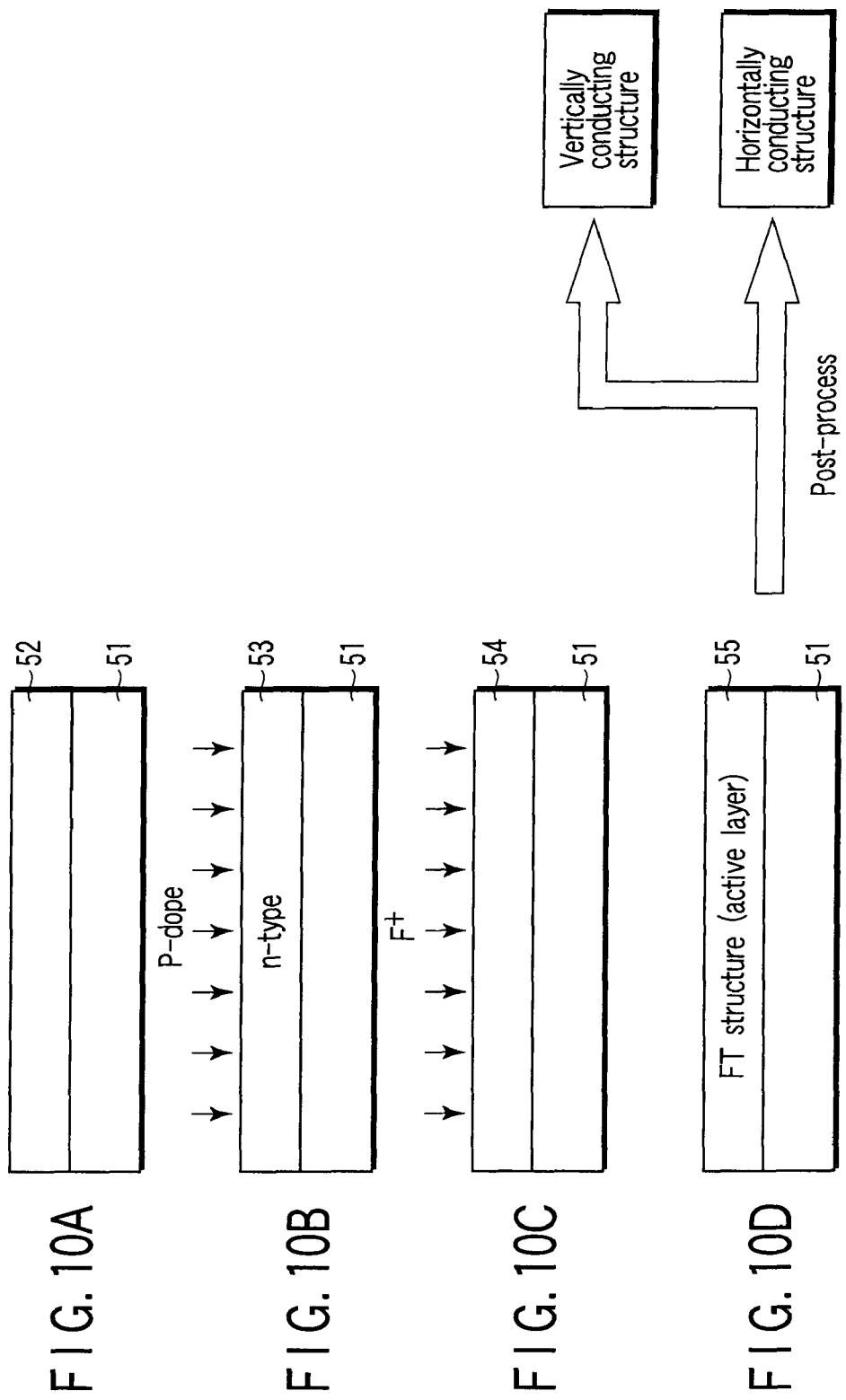

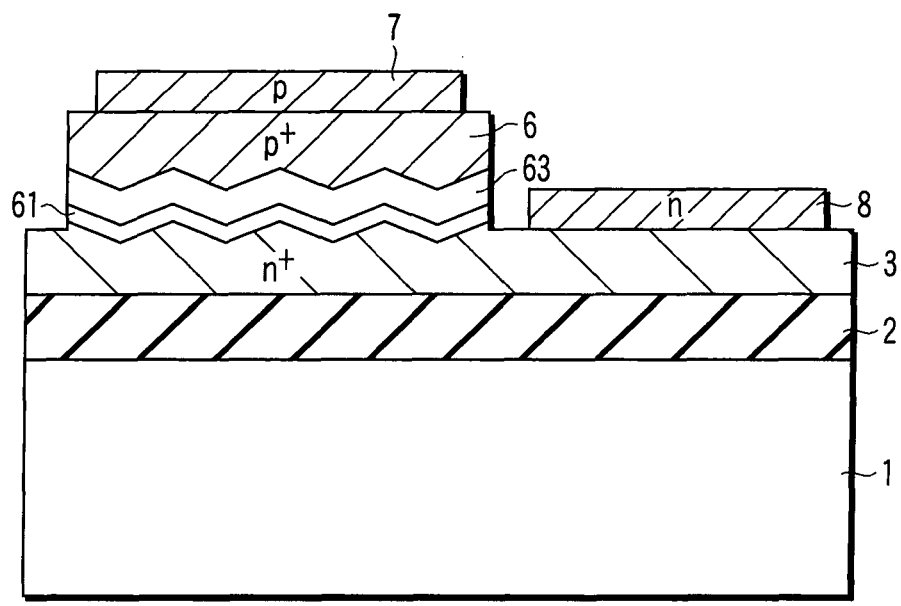
F I G. 13
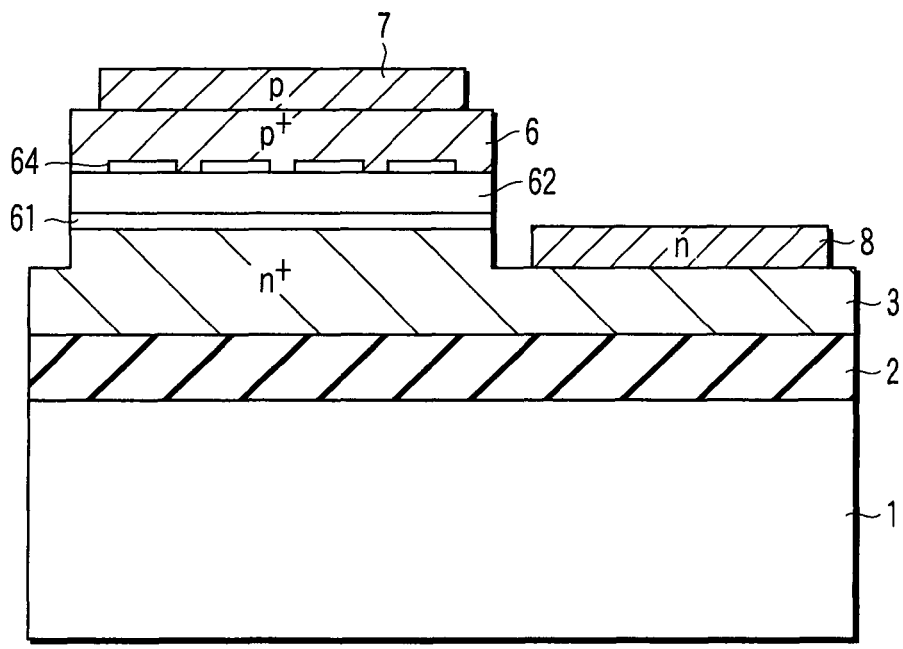
F I G. 14

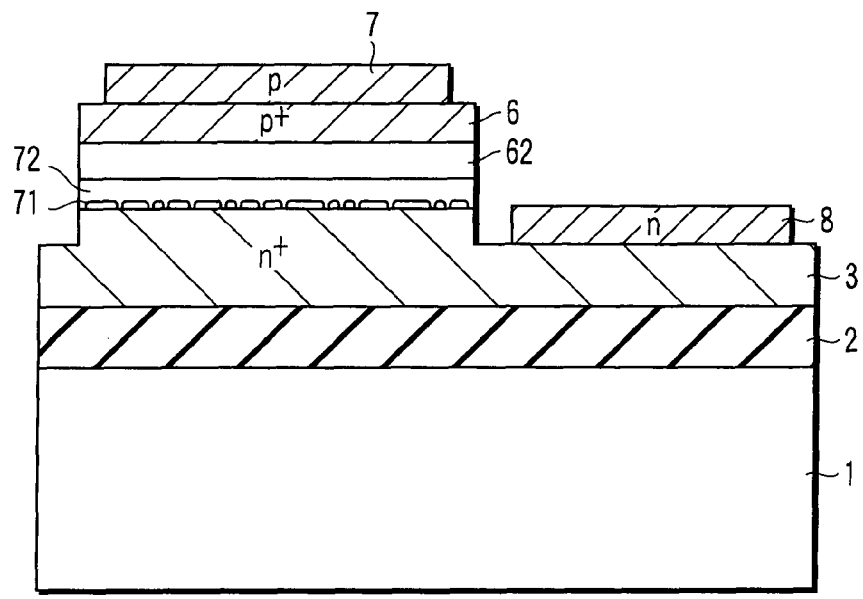
F I G. 15
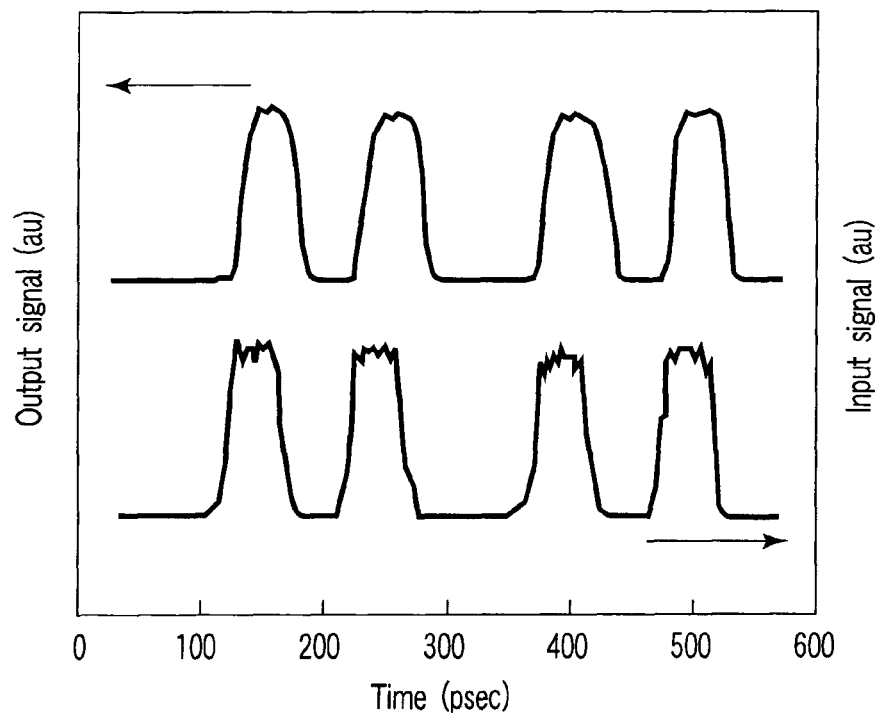
F I G. 16

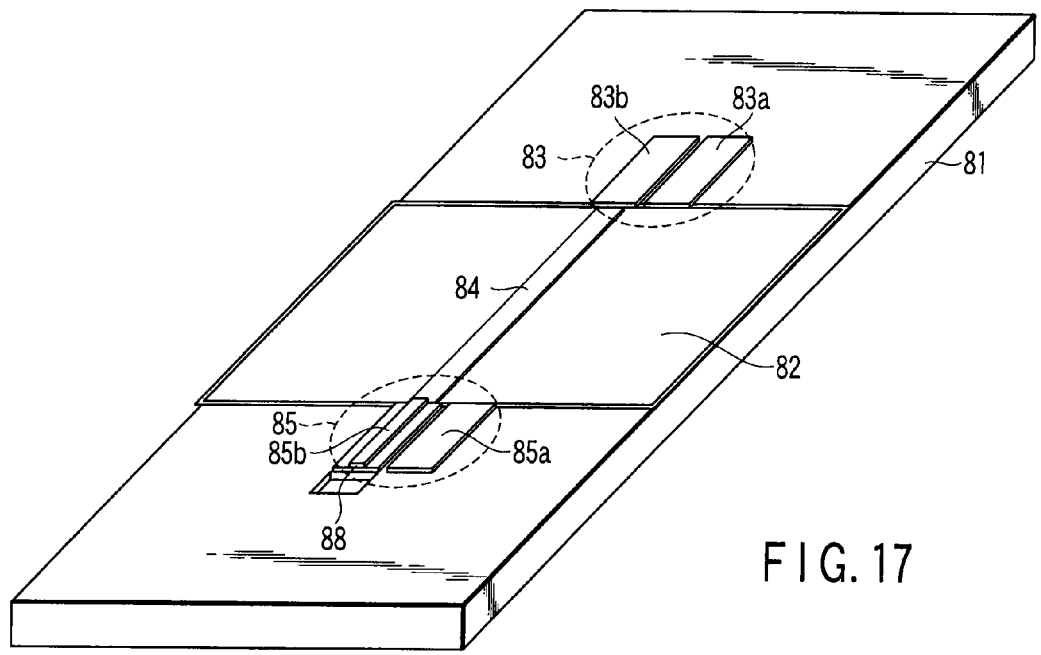
F I G. 17
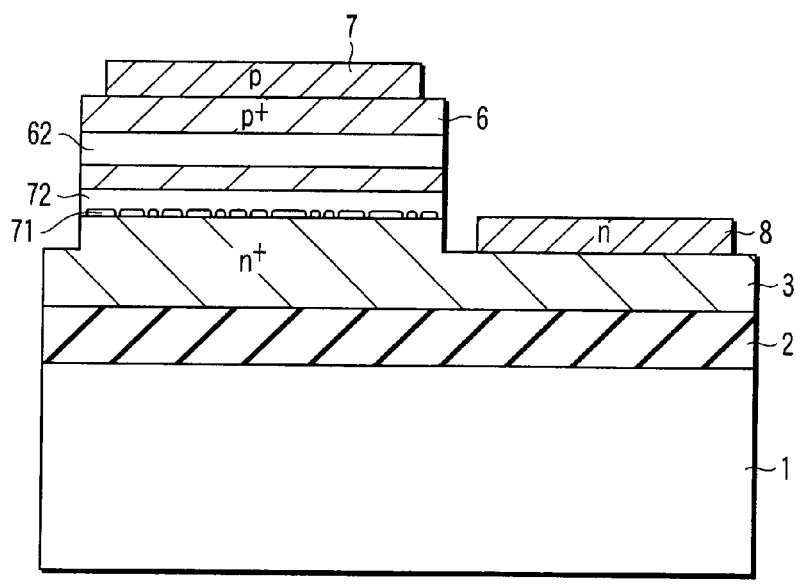
F I G. 18

US 7,838,894 B2

OPTICAL DEVICE HAVING PHOTOELECTRIC CONVERSION LAYER

CROSS-REFERENCE TO RELATED APPLICATIONS

This application is based upon and claims the benefit of priority from prior Japanese Patent Application No. 2006-270003, filed Sep. 29, 2006, the entire contents of which are incorporated herein by reference.

BACKGROUND OF THE INVENTION

1. Field of the Invention

The present invention relates to an optical device which includes germanium as the main component and which has a photoelectric conversion layer produced in an axis tensile structure or in a component of an FT structure and having an intensified sensitivity in a long-wavelength band.

2. Description of the Related Art

In general, germanium is used in optical devices as a representative photoelectric conversion material sensitive in a near-infrared region. Among the optical devices, an optical device using a germanium-based material in a photoelectric conversion layer can be manufactured on a Si substrate by a semiconductor manufacturing process, and is therefore considered a candidate of a long-wavelength band optical device in the field of photoelectric mixed LSI which has recently been actively developed.

It has been reported in, for example, M. Jutzi, IEEE Photonics Technology Lett., 17, 1510 (2005) that the external quantum efficiency of the germanium optical device sharply decreases beyond a wavelength of 1.5 µm.

Therefore, a wavelength region making it possible to achieve a high-speed response of the order of several tens of GHz is shorter than 1.5 µm. However, since the amplification region of an optical fiber serving as a communication light source is at a wavelength of 1.53 to 1.56 µm, the germanium optical device is insufficient in spectral sensitivity if the high-speed response is to be achieved in this region.

Longer wavelength absorption or strengthened absorption is effective in increasing the spectral sensitivity of the germanium optical device. Germanium is a semiconductor, and has an essential problem of low absorption in the near-infrared region in the vicinity of a band edge. The source of such an essential problem is in that the electric dipole transition between a valence band and a conduction band in the above wavelength band is originally optically forbidden.

A technique of modulating an energy band structure to control optical characteristics such as absorption and light emission is called band engineering and actively researched. Compound-semiconductor based materials are mainly used, and a quantum dot (quantum wire, superlattice) is technically well known. This quantum dot three-dimensionally (two-dimensionally, one-dimensionally) reduces the size of a substance, and confines electrons in the substance to modulate its band structure. However, according to this technique, the absorption shifts to a shorter wavelength as the size of the substance is further reduced and the electrons are confined therein. It is therefore technically difficult to increase the wavelength of the absorption of germanium or to strengthen the absorption in the long-wavelength band.

The above-mentioned quantum dot (quantum wire, superlattice) three-dimensionally (two-dimensionally, one-dimensionally) reduces the size of a substance, and confines electrons in the substance to modulate its band structure. However, according to this technique of modulating the band structure, the absorption shifts to a shorter wavelength as the size of the substance is further reduced and the electrons are confined therein. It is technically difficult to increase the wavelength of the absorption of germanium or to strengthen the absorption in the long-wavelength band.

Thus, germanium can be manufactured on the Si substrate, and is the major candidate of the long-wavelength band optical device, but it has not been in practical use due to its insufficient spectral sensitivity.

BRIEF SUMMARY OF THE INVENTION

According to embodiments of the invention provides an optical device which extends the length of a bond between germanium atoms or form an FT structure in germanium to modulate a band structure thereof and which can be practically used in a long-wavelength band.

There is provided an optical device according to the embodiment, the optical device comprising: a substrate whose lattice constant is smaller than that of germanium and which has a plane direction of a {111} face; and a photoelectric conversion layer which is disposed on the {111} face of the substrate and which is made of a tetrahedral bonded semiconductor including germanium atoms as the main components and in which a semiconductor lattice extends in the direction of a <111> axis vertical to the {111} face.

BRIEF DESCRIPTION OF THE SEVERAL VIEWS OF THE DRAWINGS

FIGS. 4A and 4B are diagrams explaining the principle of an absorption increase in a long-wavelength band attributed to a <111> axis tensile structure according to the first embodiment;

FIGS. 5A and 5B are diagrams explaining the structure of an FT semiconductor according to the first embodiment;

FIGS. 6A, 6B and 6C are diagrams explaining the real-space electronic state in a Γ point conduction band, an L point conduction band and a Γ point valence band out of the energy bands of germanium;

FIGS. 8A and 8B are diagrams showing the sectional structures of vertically conducting and horizontally conducting silicon optical devices according to the first embodiment;

FIGS. 10A, 10B, 10C and 10D are diagrams of sectional structures showing a method of forming a photoelectric conversion layer made of PF-doped FT-germanium according to the first embodiment;

FIG. 13 is a diagram showing the sectional structure of an optical device according to a third embodiment;

FIG. 14 is a diagram showing the sectional structure of an optical device according to a fourth embodiment;

FIG. 15 is a diagram showing the sectional structure of an optical device according to a fifth embodiment;

FIG. 16 is a diagram showing the characteristics of response of an optical device according to a sixth embodiment to an input signal;

FIG. 17 is a diagram showing an optical element array according to a seventh embodiment obliquely from above; and FIG. 18 is a diagram showing the sectional structures of an LD element and optical device according to the seventh embodiment.

DETAILED DESCRIPTION OF THE INVENTION

Embodiments according to the present invention will hereinafter be described in detail with reference to the drawings.

There will be described the modulation of the band structure of a semiconductor applied to a photoelectric conversion layer in an optical device in the present embodiments. In the present embodiments, light receiving elements are described as one example which are manufactured using photoelectric conversion layers having a <111> axis tensile structure and a filled tetrahedral (FT) structure, which are two band engineering methods of the optical device. It is to be noted that in the following description, ( ) indicates a (face) and [ ] indicates a [direction of crystal: direction normal to the face] in Miller indices. Moreover, { } indicates a {face} including the (faces) equivalent to each other, and < > means a <direction> including the [directions] equivalent to each other. For example, <111> means the generalization of crystal directions such as axial directions [111], [−1−11], [−11−1], [−1−1−1], etc. Moreover, {111} means the generalization of plane directions: (111) face, (−1−11) face, (−111) face, (−1−11) face, etc.

(1) Band Structure and Optical Characteristics of Germanium

Figure 2:
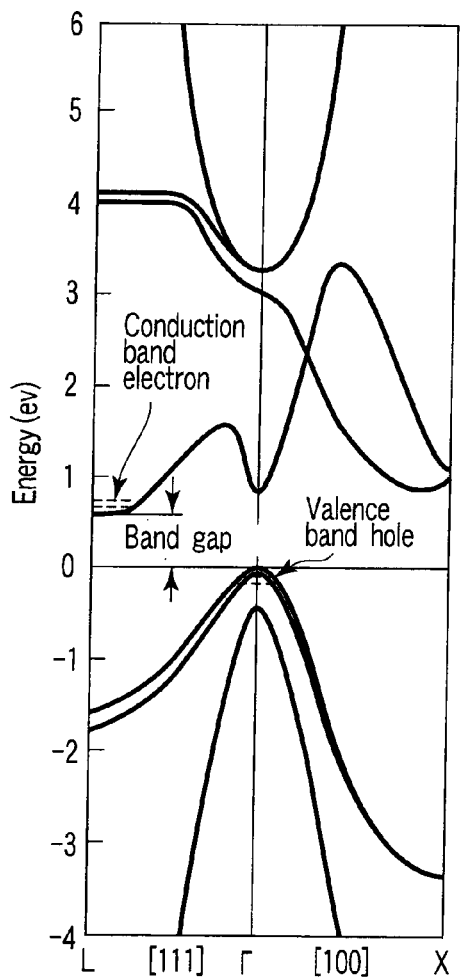
FIG. 2 is a diagram showing the band structure of germanium according to the first embodiment.

The indirect band structure of an indirect semiconductor such as germanium and the reason for its low absorption coefficient will be described. The band structure of germanium is shown in FIG. 2. The main reason that germanium is an indirect semiconductor is considered to be that a bond length d between component atoms is slightly small. An energy difference $\Delta E$ between a conduction band and a valence band at a $\Gamma$ point is greatly dependent on the bond length d, and $\Delta E$ increases along with the decrease of the bond length d. Therefore, it is assumed that the energy difference $\Delta E$ rapidly decreases when the bond length d increases, and germanium changes to have a direct band structure.

With regard to the optical characteristics of germanium, electric dipole transition is optically forbidden because germanium is an indirect semiconductor, and weak absorption is only shown in a low energy region in the vicinity of a band edge. That is, the absorption coefficient is low. In contrast, in a direct semiconductor such as GaAs, direct transition originating from the electric dipole transition is caused, and strong inter-band absorption occurs. That is, the absorption coefficient is high. The major reason for the difference between these semiconductors is in whether to satisfy two selection rules described below.

One is the selection rule of a wave number, meaning that an energy gap is minimized at a particular wave number. The other is the selection rule concerning the symmetry of a wave function, meaning that one of the conduction band and the valence band takes an even function and the other takes an odd function at a wave number which minimizes the gap.

To additionally explain the selection rule for the symmetry, the intensity of light emission and light absorbance between two levels is provided by <high level|transition dipole moment μ|low level>. In a semiconductor in which these two levels are indicated by an S-orbital (even function) and a p-orbital (odd function) in atomic orbital approximation, μ is an odd function, so that $<S|\mu|p> = \int even \cdot odd \cdot odd \, dr \neq 0$, which is optically allowed. Conversely, in a semiconductor in which both the two levels are indicated by the p-orbital, $<p|\mu|p> = \int odd \cdot odd \cdot odd \, dr = 0$, which is optically forbidden.

An optical semiconductor has the minimum gap at the $\Gamma$ point and satisfies the wave number selection rule. The optical semiconductor also satisfies the selection rule for symmetry because the wave functions of the conduction band and the valence band are respectively indicated by the S-orbital and the p-orbital. On the other hand, the indirect semiconductor does not satisfy the wave number selection rule because the wave number which minimizes the gap differs between the conduction band and the valence band, and the indirect semiconductor does not satisfy the selection rule for symmetry either because the wave functions of both the conduction band and the valence band are the p-orbitals. Therefore, the indirect semiconductor is regarded as optically forbidden.

(2) Principle of Band Structure Modulation and Absorption Modulation by <111> Axis Tensile Structure Characteristics of the <111> axis tensile structure are described, and the principle of strengthen absorption in a long-wavelength band is explained. As described above, when the interatomic bond length is small, the energy difference $\Delta E$ between the conduction band and the valence band at the $\Gamma$ point is increased, so that an indirect semiconductor tends to be produced. Known semiconductors having a small bond length include diamond (d=1.54 Å, indirect), silicon (d=2.35 Å, indirect), SiC (d=1.88 Å, indirect), BN (d=1.57 Å, indirect), BP (d=1.97 Å, indirect), GaN (d=1.94 Å, direct), GaP (d=2.36 Å, indirect), AlN (d=1.89 Å, direct), AlP (d=2.36 Å, indirect), ZnO (d=1.98 Å, indirect), etc. Many of these semiconductors tend to be indirect.

Figure 3:
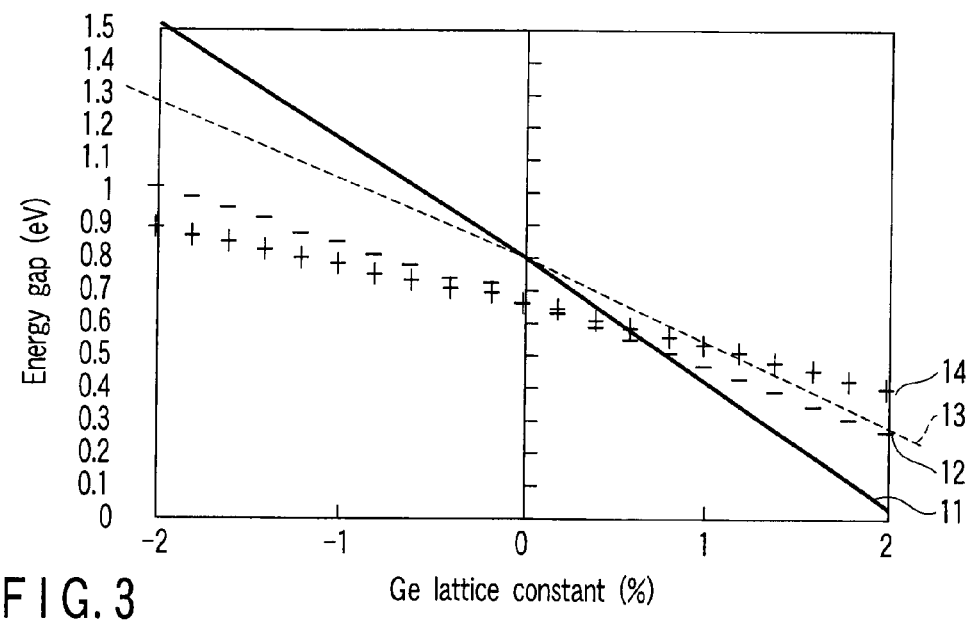
FIG. 3 is a diagram showing the lattice constant dependency of Γc, Lc and Xc energies in germanium according to the first embodiment.

FIG. 3 shows the result of calculating changes in three energy differences with respect to the change of the lattice constant in germanium, including an energy difference [$\Gamma c-\Gamma v$] 11 between a conduction band $\Gamma$ point and a valence band $\Gamma$ point, an energy difference [Lc−$\Gamma$v] 12 between a conduction band L point and the valence band $\Gamma$ point, and an energy difference [Xc−$\Gamma$v] between a conduction band X point and the valence band $\Gamma$ point.

As shown in FIG. 3, Lc−$\Gamma$v determines the band gap (0.8 eV) of germanium at a lattice constant change of 0%. Lc−$\Gamma$v gradually decreases as the lattice constant changes and becomes higher. At +0.8% or more, the lowermost end of the conduction band transfers from Lc to $\Gamma$c, and $\Gamma$c−$\Gamma$v reaches the minimum gap (0.5 eV or less). That is, germanium in a lattice constant change region of +0.8% or more changes into a semiconductor having a direct band structure, and its band gap decreases to 0.5 eV or less.

The result mentioned above concerns the case where the lattice constant of germanium three-dimensionally increases. All Ge—Ge bond lengths increase in three-dimensional tension. Thus, it is presumed that germanium changes into a direct semiconductor due to the effects of the increase of the bond length described in (1) above. However, our research has revealed that germanium can be changed into a direct semiconductor with a relatively small increase of the lattice constant even when the Ge—Ge bond in only one direction (one of the [111] axis, [−1−11] axis, [−11−1] axis and [−1−

1-1] axis) is extended among the Ge—Ge bonds extending from one Ge atom in four directions. FIG. 3 shows <111> axis tensile structures [Γc–Γv] 13 and [Lc–Γv] 14.

Qualitatively, in a structure in which another crystal axis, for example, a [100] axis is strained, the length of the Ge—Ge bond is offset by tensile stress and compression stress, so that the lattice constant change as such decreases, and the modulation of the band structure is low. However, in a structure in which the crystal axis parallel to the bond, for example, the <111> axis is strained, the length selectively increases only in the bond parallel to the <111> axis among four Ge—Ge bonds, and it is presumed that direct transition effectively occurs.

Regarding the principle of an absorption increase in the long-wavelength band due to the <111> axis tensile structure, this is due to the fact that an absorption spectrum shifts to low energy because of the narrowing of the band gap, as shown in FIG. 4B. In addition, the Γc–Γv transition which is optically allowed transition also shifts to lower energy with the decrease of the absorption energy. In a wavelength region in the vicinity of the band edge, that is, in the long-wavelength band, the absorption coefficient also dramatically increases because of an increase in the proportion of the Γc–Γv transition to the absorption due to the introduction of the tensile structure.

(3) Principle of Band Structure Modulation and Absorption Modulation by Filled Tetrahedral (FT) Structure Characteristics of the FT structure and the principle of strengthen absorption are explained.

In the following explanation, a semiconductor having an FT structure is called an FT semiconductor. The FT semiconductor means a semiconductor in which a rare gas atom 22 having a closed-shell structure is introduced into a space at an interstitial site as shown in FIG. 5A, or a semiconductor into which there is introduced a D-Z pair (or A-Z pair) which is a combination of an n-type dopant D (or p-type dopant A) 23 substituting for a lattice-point site and a heteroatom Z24 inserted in the interstitial site as shown in FIG. 5B. In addition, the arrangement of the outermost shell electron of the dopant D (or A) is equivalent to that of a germanium atom 21 owing to charge compensation effects of the D-Z pair (or A-Z pair), and the electron arrangement of the heteroatom Z24 has a closed-shell structure and is therefore the same as that of the rare gas atom 22.

Of the two kinds of FT semiconductors, the FT semiconductor in FIG. 5A into which the rare gas atom is introduced is thermally unstable. The reason is that the rare gas atom 22 easily diffuses in the host semiconductor due to heating. The FT semiconductor in FIG. 5B having the D-Z pair (or A-Z pair) is a new semiconductor devised to improve the thermal stability. In this FT semiconductor, if the dopant D (or A) is separated from the heteroatom Z24, electrostatic interaction functions between them, and force to maintain the bond therebetween is produced.

FIGS. 6A, 6B and 6C are diagrams showing real-space electronic states at a conduction band Γ point (Γc) [FIG. 6A], a conduction band L point (Lc) [FIG. 6B] and a valence band Γ point (Γv) [FIG. 6C] in the diamond structure of germanium.

As shown in FIG. 6A, germanium atoms are located at atomic coordinates (0, 0, 0) and (¼, ¼, ¼) when viewed in the <111> axis direction, and are bonded to each other by a Ge—Ge bond. Interstitial sites are arranged at atomic coordinates (²⁄₄, ²⁄₄, ²⁄₄) and (¾, ¾, ¾). A tetrahedral bond structure assumes a crystal structure with much space in which two atoms are arranged along the <111> axis, and two interstitial sites are arranged, and then two atoms are arranged again.

No atom is present at the interstitial site, but an electronic state is present at the interstitial site because an antibonding p-orbital and a bonding p-orbital of the germanium atom extend in the direction of the interstitial site. In short, a p-orbital state is present in the interstitial site. The principle of increasing absorption is that the FT structure is produced by introducing the dopant D (A) into the lattice-point site and introducing the heteroatom Z into the interstitial site, and the p-orbital is selectively modulated.

When the FT structure is produced, electrons in the interstitial site are excluded, and the energies of Lc and Γv derived from the p-orbital increase. However, the Γc energy derived from an antibonding s-orbital is hardly influenced. Therefore, the Γc–Γv energy difference decreases, and the position of Γc with respect to Γv relatively falls to cause conversion to direct transition, so that the absorption of light increases.

Figure 7A:
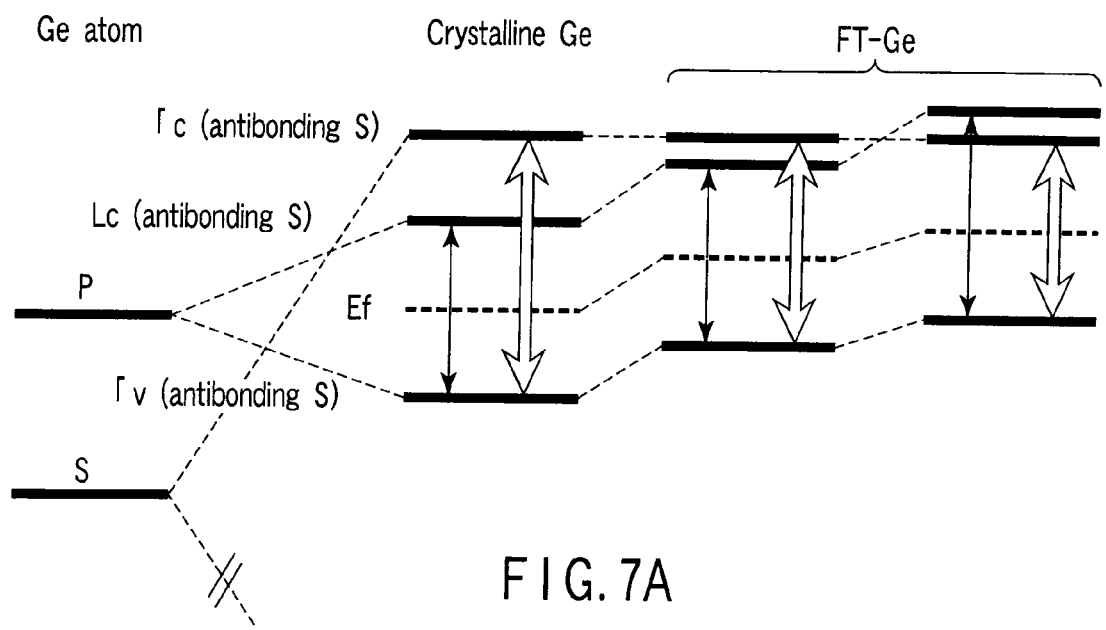
FIGS. 7A and 7B are energy band diagrams of germanium for explaining the reason that light absorption is strengthened in the FT semiconductor.
Figure 7B:
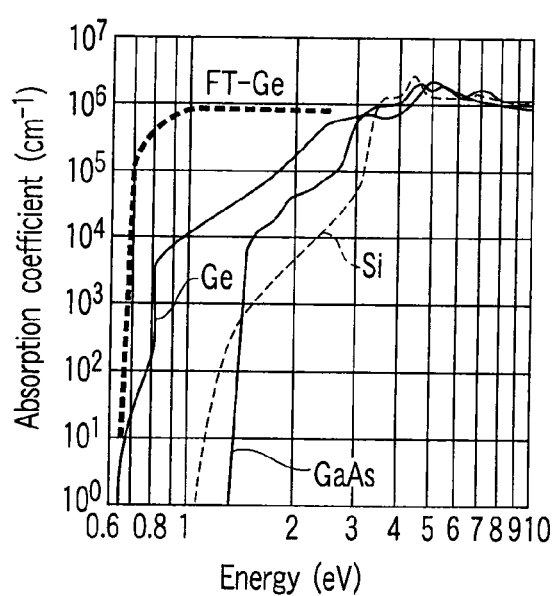

The principle of the band structure modulation and the absorption modulation of the FT structure is explained in order with reference to an energy band diagram shown in FIGS. 7A and 7B.

As shown in FIG. 7A, in germanium [crystalline Ge], the p-orbitals form the lower end of the conduction band and the upper end of the valence band, and the s-orbital is located higher than the conduction band. In the FT structure [FT-Ge], the heteroatom having the closed-shell structure is introduced into the interstitial site to raise the two p-orbitals and bring the p-orbitals closer to the s-orbital. Further, their levels are crossed to locate the upper end of the valence band of the p-orbital over the conduction band of the s-orbital. That is, the Γc–Γv transition which is optically allowed transition and which indicates strong absorption shifts to lower energy, such that the absorption coefficient in the long-wavelength band increases.

In general, when an atom is present interstitially, a deep level or a defective level may be formed in the band gap, which may have adverse effects on the efficiency of conversion from light to electricity in the photoelectric conversion layer. However, in the FT structure of the present embodiment, no such levels are formed in principle because the closed-shell structure heteroatom having a wide gap is inserted.

In the present embodiment, a semiconductor having a <111> axis tensile structure is selected from the group consisting of germanium Ge which is a single element semiconductor, and $Ge_{1-y}C_y$ ($1<y<1$), $Si_xGe_{1-x}$ ($0<x<1$) and $Si_xGe_{1-x-y}C_y$ ($0<x<1$, $1<y<1$) which are compound semiconductors.

The following methods can be taken as examples to draw the <111> axis of a semiconductor layer used for the photoelectric conversion layer.

(i) One bond direction is set as a <111> direction, and a {111} substrate is used which is made of a material having a lattice constant smaller than that of the semiconductor used for the photoelectric conversion layer, so that in-plane compression stress is applied to the photoelectric conversion layer to extend the photoelectric conversion layer in a direction normal to the substrate, that is, in the <111> axis direction.

(ii) In the above-mentioned case of (i), a substrate is used which is made of a material having a lattice constant lower than that of the semiconductor used for the photoelectric conversion layer and which has a plane direction other than {111}. For example, a (100) substrate is used. Then, the (111) face, (1–11) face, (–111) face, (–1–11) face are exposed by anisotropic etching to produce an irregular surface, on which the photoelectric conversion layer is formed. Thus, the in-plane compression stress is applied to the photoelectric conversion layer in the respective faces to extend the photoelectric conversion layer in the directions of the [111] axis, [1–11] axis, [–111] axis and [–1–11] axis.

(iii) In the above-mentioned cases of (i) and (ii), a plurality of projection structures made of a photoelectric conversion material are formed on the substrate, and a material of difference kind such as amorphous silicon or poly silicon is filled between the projections. For example, this amorphous silicon layer is selectively oxidized, such that in-plane compression is applied to the projection structure to extend the projection structure in the direction of the [111] axis (or the [1–11] axis, [–111] axis or [–1–11] axis). In addition, the projection structure means a structure in which a plurality of projections made of germanium are arranged in dot matrix form when the optical device (here, the light receiving element) is viewed from above and in which a plurality of projections are arranged on the substrate when the optical device is viewed laterally (in section). Moreover, here, the projection structure may be referred to as a germanium nano-nanodot structure wherein projections, that is, a plurality of germanium nanodot portions are juxtaposed in dot matrix form on a {111} face, around which an insulator is filled. In addition, the nanodot suggests a microstructure typically sized between one nanometer and 1000 nanometers.

(iv) In the above-mentioned cases of (i) and (ii), the photoelectric conversion layer is formed on the substrate, and a laminated film producing in-plane compression stress is formed at the top of the photoelectric conversion layer to extend the photoelectric conversion layer in the direction of the [111] axis (or the [1–11] axis, [–111] axis or [–1–11] axis).

(v) In contrast with the above-mentioned cases of (i) and (ii), a material is used for the substrate which has a lattice constant larger than that of the semiconductor used for the photoelectric conversion layer, and the substrate is used which satisfies $L \times A + M \times B + N \times C = 0$ where the plane direction of the substrate is set as an (LMN) face and the <111> axis is represented by an <ABC> axis. Thus, the in-plane tensile stress is applied to the photoelectric conversion layer to extend the photoelectric conversion layer in the <111> axis direction parallel to the face of the substrate. In addition, if the face of the substrate is parallel to the [–111] axis, a combination of LMN in which the inner product of a substrate normal vector (L, M, N) and a vector (–1, 1, 1) is zero may be selected in order to extend the [–111] axis. That is, a {110} face may be selected as the plane direction of the substrate.

A substrate having a lattice constant smaller than that of the semiconductor used for the photoelectric conversion layer includes silicon which is a single element semiconductor. Further, a selection can be made out of the group consisting of $Ge_{1-y}C_y$ (1<y<1), $Si_xGe_{1-x}$ (0<x<1) and $Si_xGe_{1-x-y}C_y$ (0<x<1, 1<y<1) which are compound semiconductors similar to the photoelectric conversion layer. In this case, a compound semiconductor is used for the substrate in which a composition ratio x, y between Si and C is higher than the composition ratio of the photoelectric conversion layer. Therefore, the lattice constant of the substrate is smaller than that of the photoelectric conversion layer.

Conversely, as a substrate having a lattice constant larger than that of the photoelectric conversion layer, a pseudo III-V compound semiconductor substrate can be used in which the top of a silicon substrate is covered with an antimony-based III-V compound semiconductor layer indicated by MSb (M=Al, Ga, In or an alloy of these substances).

There is a well-known technique wherein germanium is grown on a Si {100} substrate, and tensile stress is applied to germanium by use of strain effects caused by a lattice mismatch to increase the wavelength of absorption (JP-A 2005-530360 (TOKUHYO)). This method is technically quite different from others in that the tensile stress is exerted in the [100] axis direction instead of the [111] axis direction. As described in the above section "Principle of band structure modulation and absorption modulation by <111> axis tensile structure", the [100] axis tensile structure has a disadvantage that the length of the Ge—Ge bond is offset by tensile stress and compression stress, so that the lattice constant change itself decreases, and the modulation of the band structure is low.

According to JP-A 2005-530360 (TOKUHYO), the band structure is indirect up to a lattice constant change of +2%, and the amount of the decrease of the band gap is 0.1 eV at +0.8%. A greater lattice constant change is necessary to cause band modulation than in the <111> axis tensile structure. In short, this method using the (100) substrate has a smaller effect of modulating the band of germanium than in the method of the present embodiment in which {111} substrate is used to selectively draw the <111> axis.

Furthermore, in the present embodiment, the following can be taken as examples of combinations of the host semiconductor, the dopant D or A, and the heteroatom Z that are contained in an FT semiconductor.

(vi) The host semiconductor is selected from the group consisting of IVb single semiconductors and IVb-IVb compound semiconductors. The dopant D is selected from the group consisting of Va elements or Vb elements. The heteroatom Z is selected from the group consisting of VIIb elements.

(vii) The host semiconductor is selected from the group consisting of IVb single semiconductors and IVb-IVb compound semiconductors. The dopant A is selected from the group consisting of IIIa elements or IIIb elements. The heteroatom Z is selected from the group consisting of Ia elements or Ib elements.

The following can be taken as examples of combinations of a host semiconductor other than the IVb-based host semiconductors, the dopant D or A, and the heteroatom Z.

The following can be taken as examples of the host semiconductor. The IVb single semiconductor signifies germanium. The IVb-IVb compound semiconductor is selected from the group consisting of $Ge_{1-y}C_y$ (1<y<1), $Si_xGe_{1-x}$ (0<x<1) and $Si_xGe_{1-x-y}C_y$ (0<x<1, 1<y<1).

Furthermore, the following can be taken as examples of the dopant D, A, and the heteroatom Z. The Ia element is selected from the group consisting of Li, Na, K, Rb and Cs. The Ib element is selected from the group consisting of Cu, Ag and Au. The IIIa element is selected from the group consisting of Sc, Y and La. The IIIb element is selected from the group consisting of B, Al, Ga, In and Ti. The Vb element is selected from the group consisting of N, P, As, Sb and Bi. The VIIb element is selected from the group consisting of F, Cl, Br and I.

The optical device according to the present embodiment has a germanium-based photoelectric conversion layer with the <111> axis tensile structure or the FT structure. The arrangement of electrodes in the photoelectric conversion layer is not specifically limited.

FIGS. 8A and 8B show sectional views of germanium-based optical devices according to the embodiment of the present invention. Here, FIG. 8A shows a vertically conducting light receiving element, and FIG. 8B shows a horizontally conducting light receiving element.

In the vertically conducting light receiving element in FIG. 8A, a photoelectric conversion layer 33 made of germanium in which a semiconductor lattice extends vertically to the main face of the substrate is formed on a silicon $n^+$ area 32 of the substrate, and a silicon $p^+$ area 34 is formed on the photoelectric conversion layer 33. In this configuration, the n$^+$ area 32 is in contact with the silicon p$^+$ area 34 across the photoelectric conversion layer 33. An n-electrode 31 is formed in the silicon n$^+$ area 32, and a p-electrode 36 is connected to the silicon p$^+$ area 34. The photoelectric conversion layer 33 and the p-electrode 36 are insulated from each other by an insulating layer 35.

In this vertically conducting light receiving element, light carriers (electrons and holes) produced in the photoelectric conversion layer 33 are vertically drifted, and electrons are taken from the n-electrode 31 via the n$^+$ area 32 while holes are taken from the p-electrode 36 via the p$^+$ area 34, thereby obtaining a photocurrent.

In the horizontally conducting light receiving element in FIG. 8B, an embedded oxide film 38 is formed on a silicon substrate 37, on which a photoelectric conversion layer 39 made of germanium having semiconductor photons extending vertically to the main face of the substrate is formed. The photoelectric conversion layer 39 is element-isolated by an insulating film 40. An n$^+$ area 42 and a p$^+$ area 41 are formed in the surface of the photoelectric conversion layer 39 so that the photoelectric conversion layer 39 is interposed therebetween in the same face. An n-electrode 44 is connected to the n$^+$ area 42, and a p-electrode 43 is connected to the p$^+$ area 41.

In this horizontally conducting light receiving element, light carriers (electrons and holes) produced in the photoelectric conversion layer 39 are horizontally drifted, and electrons are taken from the n-electrode 44 via the n$^+$ area 42 while holes are taken from the p-electrode 43 via the p$^+$ area 41, thereby obtaining a photocurrent.

In addition, while current leakage is prevented by the provision of the embedded oxide film in both the vertically conducting light receiving element and the horizontally conducting light receiving element, the embedded oxide film is not necessarily required when insulation can be ensured by any means such as an element configuration, substrate resistance or circuits.

FIGS. 8A and 8B show the basic structures of the light receiving elements, and various structures can be conceived for specific light receiving elements. The light receiving element according to the present embodiment can be used as a single element.

Furthermore, a plurality of light receiving elements may be integrated and arrayed on the same substrate to produce a CCD image sensor or a CMOS image sensor. A plurality of light receiving elements may be integrated on the same substrate to produce a solar battery panel. A light receiving element, a light emitting element, and a waveguide connecting these elements may be integrated to produce an optical device array on the same substrate. Modifications of these configurations will be described later in more detail.

Next, a process of forming the photoelectric conversion layer having the <111> axis tensile structure will be described with reference to a sectional configuration shown in FIGS. 9A, 9B, 9C and 9D. Here, a process of forming the photoelectric conversion layer comprising a germanium projection structure will be described.

Figure 9A:
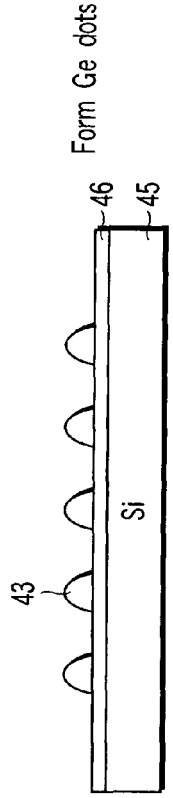
FIGS. 9A, 9B, 9C and 9D are diagrams of sectional structures showing a method of forming a photoelectric conversion layer made of germanium having a tensile structure according to the first embodiment.

In a manufacturing step shown in FIG. 9A, a Si {111} substrate 45 is prepared, and germanium projections (germanium projection structure) 47 are grown on an n-type silicon layer 46 by use of a CVD apparatus capable of film formation under an atmosphere at an ultra-high vacuum level. Here, a germane gas diluted with a hydrogen gas is used as a germanium source. The n-type silicon layer 46 is formed on the surface of the Si substrate 45 by impurity diffusion or ion implantation. Then, after the oxide film on the surface of the Si substrate 45 is removed by a diluted hydrofluoric acid treatment, the Si substrate 45 is spin-dried, and introduced into a reactor chamber by way of a pre-chamber of the CVD apparatus. Germane is supplied to the Si substrate 45 which is heated at a constant temperature, such that the germanium projection structure is formed on the n-type silicon layer 46. It is considered that germane grows into a projecting shape rather than a film shape because a Stranski-Krastanov (SK) growth mode is dominant.

Since the sizes of the projections 47 of the germanium projection structure are greatly dependent on the temperature of the substrate and on the amount of germane supplied, the sizes can be controlled by the control of these conditions. It is desirable that an average size of the germanium projections 47 used for the light receiving elements in the present embodiment include a height ranging between 10 nm and 100 nm, and a diameter of the face contacting the substrate ranging between 80 nm and 800 nm.

In addition, the provision of a silicon buffer layer on the surface of the substrate by use of a silane gas immediately before the formation of the germanium projections 47 is effective (not shown). The Si substrate 46 is planarized and its surface is normalized by the provision of such a silicon buffer layer, which provides an advantage that a germanium projection structure having an even size can be obtained.

Figure 9B:
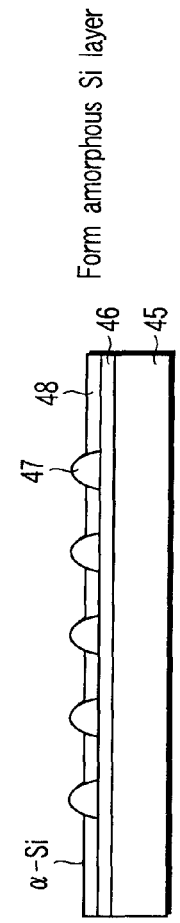

In a manufacturing step shown in FIG. 9B, an amorphous silicon layer 48 is then formed by the CVD apparatus, and this amorphous silicon layer 48 is etched back by an RIE apparatus to expose the tops of the germanium projections 47.

Figure 9C:
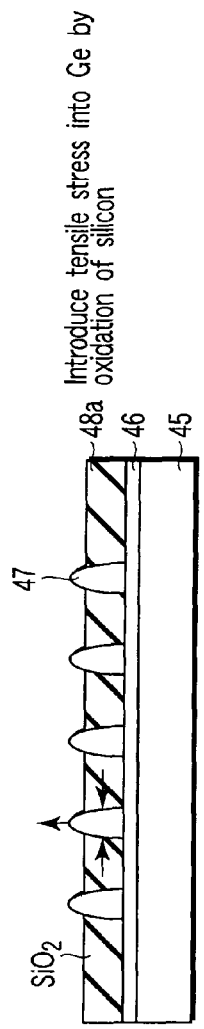

In a manufacturing step shown in FIG. 9C, the amorphous silicon layer 48 is selectively oxidized in an oxidation furnace for conversion to silicon oxide. At this point, amorphous silicon expands horizontally as well as vertically when amorphous silicon is oxidized into silicon oxide, so that the germanium projections 47 are subjected to compression stress which reduces their diameters. To alleviate this compression stress, the semiconductor lattice extends in the <111> axis direction. Owing to such extension effects, a photoelectric conversion layer 48a is formed which has a tensile structure and whose shape has been converted into the germanium projection structure. In this oxidizing step, the degree of the deformation of the semiconductor lattice in the <111> axis direction can be controlled by the adjustment of the oxidizing temperature, process time, etc.

Figure 9D:
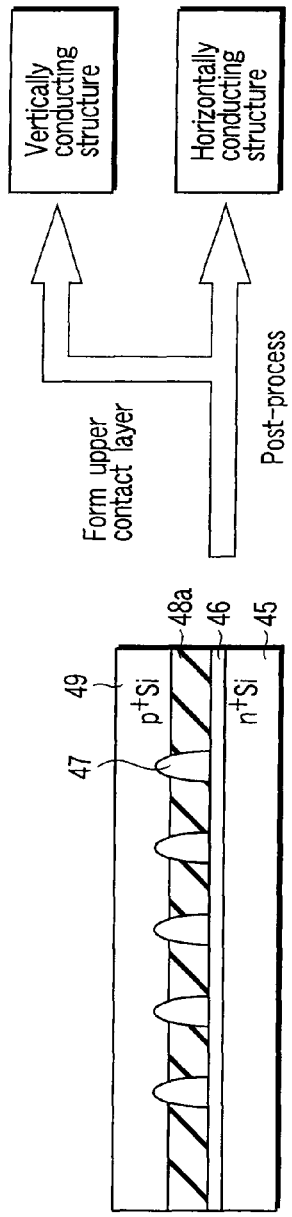

In a manufacturing step shown in FIG. 9D, a silicon layer 49 is formed on the silicon oxide film 48a by use of the CVD apparatus, and converted to p$^+$ by an ion implantation step. Likewise, the thickness on the side of the Si {111} substrate 45 is reduced by a CMP device, and the Si {111} substrate 45 is converted to n$^+$ by an ion implantation step.

Furthermore, electrodes and an interlayer insulating film are formed by use of ordinary manufacturing steps, such that an optical device for the vertically conducting light receiving element as shown in FIG. 8A can be manufactured. Alternatively, an optical device for the horizontally conducting light receiving element as shown in FIG. 8B can be manufactured by other ordinary manufacturing steps.

The photoelectric conversion layer having the <111> axis tensile structure can be formed by the manufacturing process as described above. In addition, the manufacturing process described above is one example, and a photoelectric conversion layer having a tensile structure can also be formed by other manufacturing techniques or manufacturing processes.

Optical measurement such as Raman scattering can be used as an indirect and convenient method for detecting the deformation of the lattice of germanium. In this measurement, germanium causes vibration of natural mode originating from the Ge—Ge bond at a wave number of about 300 cm$^{-1}$ when there is no lattice deformation. When the lattice deforms, the wave number of the vibration of natural mode changes accordingly. The evaluation of the vibration mode is one of the reliable means of checking the presence of the lattice deformation. Here, the wave number of the vibration of natural mode decreases when the lattice extends, while the wave number of the vibration of natural mode increases when the lattice shrinks.

Next, a process of forming the photoelectric conversion layer having the FT structure will be described with reference to a sectional configuration shown in FIGS. 10A, 10B, 10C and 10D. Here, a process of forming the photoelectric conversion layer comprising germanium doped with a P-F pair will be described.

In a manufacturing step shown in FIG. 10A, a germanium layer 52 is formed on a Si wafer 51. Then, in a manufacturing step shown in FIG. 10B, the germanium layer 52 is doped with phosphorus (P) as an n-type dopant D.

In a manufacturing step shown in FIG. 10C, a germanium layer 54 is formed in which fluorine ions (F$^+$) are implanted as the heteroatom Z into a P-doped n-type germanium layer 53. In this ion implantation step, energy, a dose amount, the plane direction of the substrate, the tilt angle, the temperature of the substrate, etc. are optimized. It is considered that F$^+$ ions receive extra electrons possessed by P-atoms and electrons supplied from a ground via the substrate and thus become F$^-$ ions.

In a manufacturing step shown in FIG. 1D, the strained germanium layer 54 is annealed, and the lattice disturbed by the ion implantation is recrystallized to form a photoelectric conversion layer 55 made of FT-germanium in which the P-F pair is introduced. In this annealing step, the adjustment of an anneal temperature, a treatment time, a gas atmosphere, etc. allows the P-atom to substitute for the germanium atom at the lattice point, and F-atom to be interstitially inserted. The P-atom is positioned at the lattice point but deprived of electrons by the F-atom, and therefore becomes electrically inert and highly resistive. The P-atom and the F-atom are bonded to each other by ion bonding, and are not dissociated from each other even by a temperature rise due to the annealing and maintain a paired state.

Furthermore, electrodes and an interlayer insulating film are formed by use of other ordinary manufacturing steps, such that it is possible to manufacture an optical device for the vertically conducting light receiving element as shown in FIG. 8A or the horizontally conducting light receiving element as shown in FIG. 8B.

As described above, the photoelectric conversion layer having the FT structure in the host semiconductor can be formed by the manufacturing process combining the ion implantation and the annealing treatment. In addition, thermal diffusion may be combined with the annealing treatment to form the photoelectric conversion layer having the FT structure. The photoelectric conversion layer having the FT structure may be formed by use of manufacturing process other than those described above. Moreover, a photoelectric conversion layer combining the tensile structure and the FT structure may be formed.

When the dopant D at the lattice point is bonded to the interstitial heteroatom Z as in the P-F pair, the vibration of natural mode different from the lattice vibration of the host semiconductor is produced. Therefore, the FT structure can be directly analyzed from infrared spectrum and Raman spectrum. Taking the P-F pair as an example, a mode of vibration emerges at a wave number of about 150 to 200 cm$^{-1}$, from a normal vibration calculation. Thus, the evaluation of the vibration mode is one of the reliable means of checking the presence of the FT structure.

Electric resistance or electric measurement such as hole measurement can be used as an indirect and convenient method for detecting the presence of the D-Z (or A-Z) pair. When the n-type or (p-type) dopant is used, the substrate before doped with the interstitial heteroatom Z is an n-type or (p-type) and has low resistance. Here, if the heteroatom Z is paired with the dopant D (or A), free carriers decrease due to charge compensation, and the substrate becomes highly resistive. Thus, it is possible to know whether the DZ (or AZ) pair has been formed by checking the electric resistance and the change of carrier concentration before and after doping with the heteroatom Z.

Figure 1A:
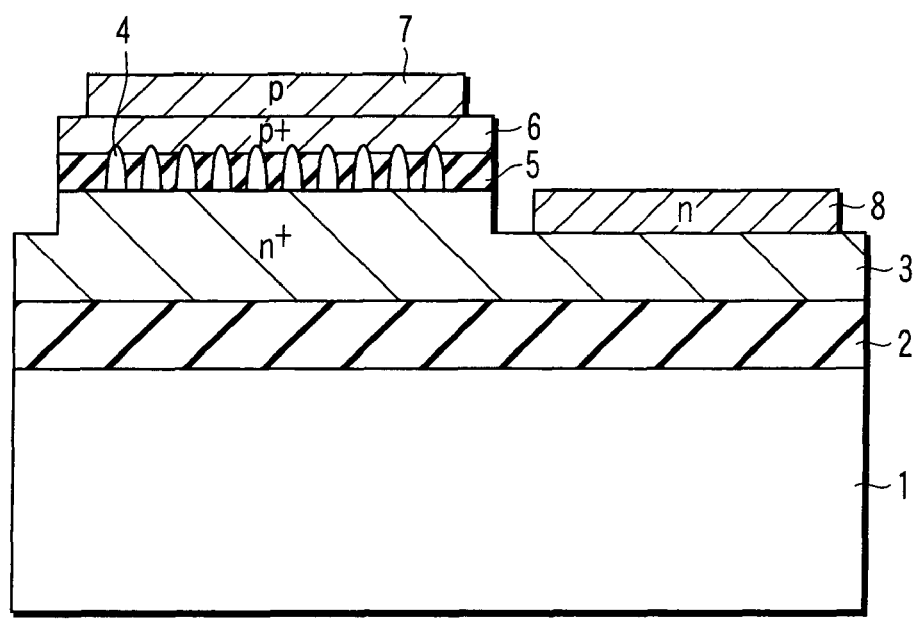
FIGS. 1A and 1B are diagrams showing the sectional structure of an optical device according to a first embodiment.
Figure 1B:
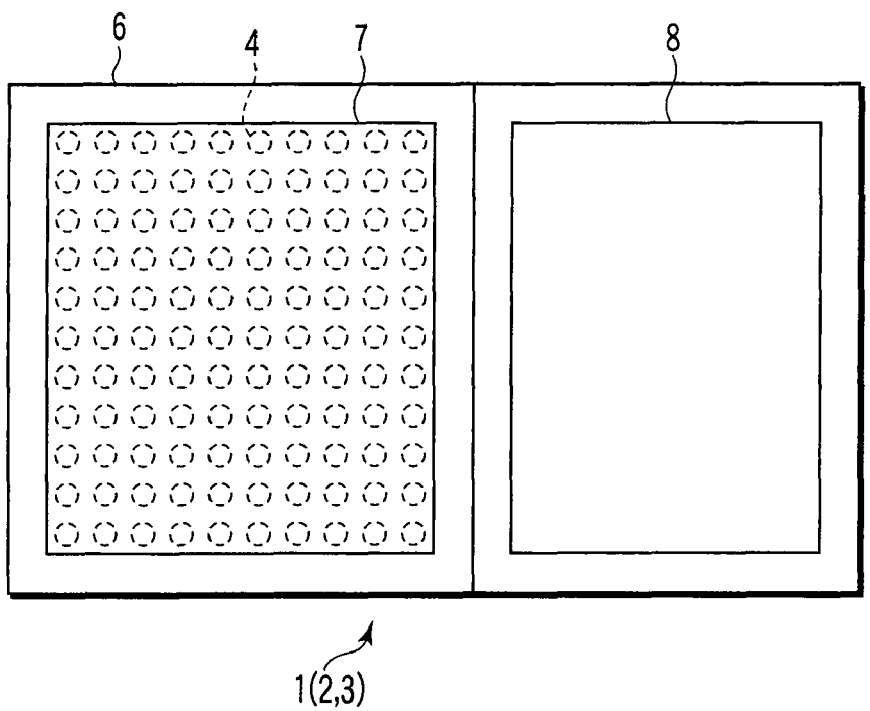

Next, the light receiving element comprising the photoelectric conversion layer described above will be explained as a first embodiment. FIGS. 1A and 1B show the sectional configuration of the vertically conducting light receiving element comprising the photoelectric conversion layer which includes <a tensile structure, a {111} substrate and a germanium projection structure> according to the first embodiment.

In this light receiving element, an embedded oxide film 2 is formed on a silicon substrate 1, and an n-type silicon layer 3 converted to n$^+$ is formed by ion implantation. One method to form the embedded oxide film 2 is to use a bonded substrate. For example, an oxide film (the embedded oxide film 2) is formed on one main face of a first silicon substrate {111} by a method such as thermal oxidation. The main face of a second silicon substrate {111} is affixed to and integrated with the oxide film. On this n-type silicon layer 3, there are formed a plurality of germanium projections 4 in which a semiconductor lattice extends in the <111> axis direction, and an insulating layer 5 filled around the germanium projections 4 (the stack of these components are the photoelectric conversion layer). Further, a p-type silicon layer 6 and a p-electrode 7 that are converted to p$^+$ are formed on the tops of the germanium projections 4 and the insulating layer 5. Moreover, one region of the n-type silicon layer 3 is cut and exposed in the form of a trench, on which an n-electrode 8 is further formed.

The substrate lattice constant of the n-type silicon layer 3 is lower than that of germanium, and the n-type silicon layer 3 has the substrate plane direction of the {111} face and functions as a substrate for the photoelectric conversion layer. The photoelectric conversion layer is formed in accordance with the manufacturing process explained with FIG. 9. It has been confirmed from Raman spectrum that the germanium <111> axis in a direction normal to the substrate has extended.

The band gap of germanium having the tensile structure is about 0.5 eV which is smaller than the band gap of crystalline germanium. Since the band edge has shifted to low energy, a light absorption coefficient in the near-infrared region is significantly enhanced at $10^5$ cm$^{-1}$ or more. When the photoelectric conversion layer of this optical device is photoexcited, a photocurrent is produced.

Although not shown in FIG. 1, a drive voltage V is applied across the n-electrode 8 and the p-electrode 7 in order to effectively take the photocurrent produced in the photoelectric conversion layer from the electrodes to the outside. The intensity of the drive voltage V can be V<$V_{oc}$, where $V_{oc}$ is the voltage of the open end of this light receiving element. Conversely, in the case where V>$V_{oc}$, external carriers are injected from the electrodes to the photoelectric conversion layer and offset by the photocurrent, so that the photocurrent apparently decreases. Therefore, the setting of the drive voltage V is an important factor in deciding element characteristics. In addition, the open end voltage $V_{oc}$ can be found from a voltage ($V=V_{oc}$) at which the photocurrent is zero by swinging the drive voltage.

Figure 11:
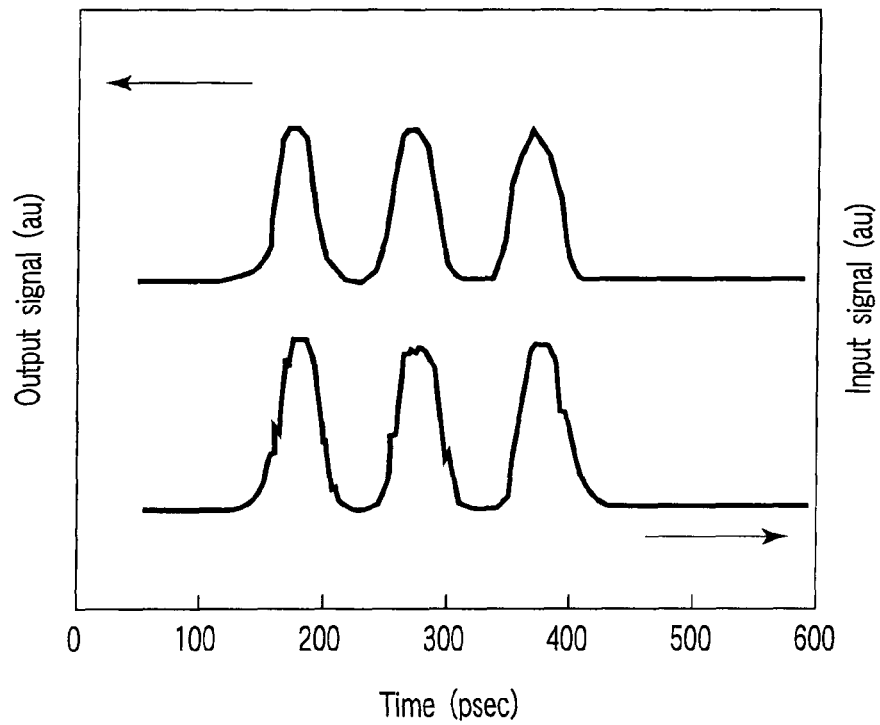
FIG. 11 is a diagram showing the characteristics of response of the optical device according to the first embodiment to an input signal.

FIG. 11 shows the response characteristics of an output photocurrent when an optical signal at a wavelength of 1550 nm modulated at 10 GHz is input to the light receiving element of the present embodiment. As can be understood from FIG. 11, an output photocurrent having about the same waveform as that of the input optical signal is obtained. Thus, the light receiving element of the present embodiment enables high-speed and supersensitive optical detection of near-infrared light at a wavelength of 1550 nm having low spectral sensitivity in crystalline germanium.

It is understood from what has been described above that the tensile structure in which the energy band is modulated to strengthen the absorption is significantly effective as a method of increasing the wavelength of the photoelectric conversion layer of the germanium light receiving element.

Figure 12:
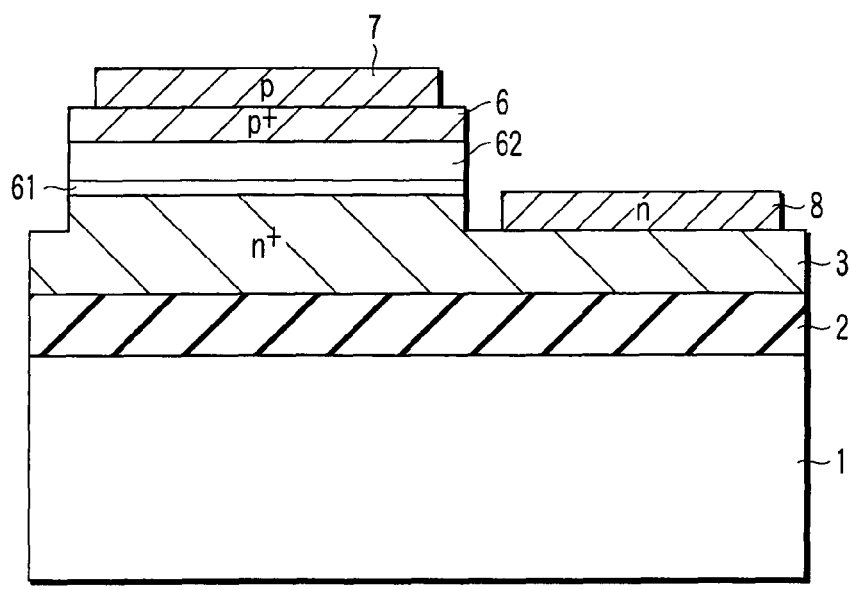
FIG. 12 is a diagram showing the sectional structure of an optical device according to a second embodiment.

Next, a light receiving element comprising the above-described photoelectric conversion layer will be explained as a second embodiment. FIG. 12 shows the sectional configuration of the vertically conducting light receiving element comprising the photoelectric conversion layer which includes <a tensile structure, a {111} substrate and germanium> according to the second embodiment. The present embodiment is different from the above-described first embodiment in the photoelectric conversion layer, etc., but other components are the same, and the same reference signs are assigned to these components without describing such components.

Before the formation of photoelectric conversion layers 61 and 62, an embedded oxide film 2 and an n-type silicon layer 3 are stacked and formed on a {111} silicon substrate 1. The silicon germanium buffer layer 61 is formed on the n-type silicon layer 3, and then the strained germanium layer 62 is formed thereon. The difference of lattice constant between silicon and germanium is about 4% and is thus large, so that if germanium is epitaxially grown directly on silicon, defects such as dislocation tends to be produced in the film, and a photoelectric conversion layer with a high dark current may be created. Thus, the silicon germanium buffer layer 61 whose value of the lattice constant is located between those of the adjacent layers is inserted into the stacked structure, thereby enabling the epitaxial growth of the strained germanium layer 62 subjected to compression stress in the in-plane direction of the substrate and to tensile stress in the direction normal to the substrate. It has been confirmed from Raman spectrum that the germanium <111> axis in the direction normal to the substrate has extended.

The band gap of germanium having the tensile structure is about 0.5 eV which is smaller than the band gap of crystalline germanium. Since the band edge has shifted to low energy, a light absorption coefficient in the near-infrared region is significantly enhanced at $10^5$ cm$^{-1}$ or more. When the photoelectric conversion layer of this optical device is photoexcited, a photocurrent is produced.

When an optical signal at a wavelength of 1550 nm modulated at 10 GHz is input to the light receiving element of the present embodiment, an output photocurrent having about the same waveform as that of the input optical signal is obtained, as in FIG. 11 explained above. Thus, the light receiving element of the present embodiment enables high-speed and supersensitive optical detection of near-infrared light at a wavelength of 1550 nm having low spectral sensitivity in crystalline germanium.

Next, a light receiving element comprising the above-described photoelectric conversion layer will be explained as a third embodiment. FIG. 13 shows the sectional configuration of the vertically conducting light receiving element comprising the photoelectric conversion layer which includes <a tensile structure, a (100) substrate and germanium> according to the third embodiment. The present embodiment is different from the above-described second embodiment in the silicon substrate, the photoelectric conversion layer, etc., but other components are the same, and the same reference signs are assigned to these components without describing such components.

In the present embodiment, a {100} silicon substrate is used, and the surface of the substrate is subjected to anisotropic etching with a KOH solution to expose the (111) face, the (−111) face, the (1−11) face and the (−1−11) face, so that an inverted-pyramid shaped irregular face is provided. It has been confirmed from Raman spectrum that the germanium [111] axis, [−111] axis, [1−11] axis and [−1−11] axis have extended.

By checking the response characteristics of an output photocurrent when an optical signal at a wavelength of 1550 nm modulated at 10 GHz is input to the light receiving element of the present embodiment, it has been proved that an output photocurrent having about the same waveform as that of the input optical signal is obtained.

According to the present embodiment, an easily processed {100} substrate is used, and the substrate is etched to expose the {111} face, on which a germanium photoelectric conversion layer having a tensile structure is formed, thereby making it possible to increase the speed and sensitivity of the optical device in the long-wavelength band.

Next, a light receiving element comprising the above-described photoelectric conversion layer will be explained as a fourth embodiment. FIG. 14 shows the sectional configuration of the vertically conducting light receiving element comprising the photoelectric conversion layer which includes <a tensile structure, a (111) substrate and a germanium laminated film> according to the fourth embodiment. The present embodiment is different from the above-described second embodiment in a stacked structure formed by a silicon nitride film with which the top of the photoelectric conversion layer is pattered. Other components are the same, and the same reference signs are assigned to these components without describing such components.

A silicon nitride film 64 applies in-plane compression stress to a strained germanium layer 62.

The silicon nitride film 64 is in the shape of a small piece, for example, a small rectangle. The silicon nitride films 64 are arranged, for example, in matrix form or with a checkered pattern on the strained germanium layer 62 by patterning. Alternatively, the silicon nitride films 64 may be formed by small circular pieces arranged in dot matrix form. Thus, the silicon nitride films 64 have only to be arranged so that areas where the silicon nitride films 64 are present are equal to areas without the silicon nitride films 64 on the strained germanium layer 62, and the arrangement is not specifically limited. Moreover, when there is a desired distribution of the in-plane compression stress, the silicon nitride films 64 may be arranged suitably to this distribution.

Thus, the strained germanium layer 62 is subjected to compression stress from both a lower silicon germanium buffer layer 61 and the upper silicon nitride films 64, so that the lattice more easily extends in the <111> axis direction. It has been confirmed from Raman spectrum that the germanium <111> axis has extended.

By checking the response characteristics of an output photocurrent when an optical signal at a wavelength of 1700 nm modulated at 10 GHz is input to the optical device of the present embodiment, it has been proved that an output photocurrent having about the same waveform as that of the input optical signal is obtained.

According to the present embodiment, it is possible to increase the operation speed and sensitivity of the light receiving element in a longer wavelength band by forming the germanium photoelectric conversion layer having the tensile structure in which the in-plane compression stress is applied to the germanium layer (strained germanium layer) from the upper and lower layers.

Next, a light receiving element comprising the above-described photoelectric conversion layer will be explained as a fifth embodiment.

FIG. 15 shows the sectional configuration of the vertically conducting light receiving element comprising the photoelectric conversion layer which includes <a tensile structure> according to the fifth embodiment. The present embodiment is different from the above-described second embodiment in the silicon substrate, the photoelectric conversion layer, etc., but other components are the same, and the same reference signs are assigned to these components without describing such components.

In this light receiving element, an embedded oxide film 2 is formed on a silicon {110} face substrate 1, and an n-type silicon layer 3 converted to n$^+$ is formed by ion implantation. One region of the n-type silicon layer 3 is cut and exposed in the form of a trench, on which an n-electrode 8 is formed.

On this n-type silicon layer 3, there are formed a III-V compound semiconductor buffer layer comprising a plurality of juxtaposed aluminum antimony projections 71 and a gallium antimony layer 72 burying the peripheries and tops of the aluminum antimony projections 71, and a strained germanium layer 62 which is the photoelectric conversion layer. Further, a p-type silicon layer 6 and a p-electrode 7 that are converted to p$^+$ are formed on the top of the strained germanium layer 62.

The process of manufacturing the III-V compound semiconductor buffer layer and the strained germanium layer will be described.

First, the aluminum antimony projection structure is grown on the n-type silicon layer 3 of the pretreated silicon {110} face substrate 1. After the removal of a surface oxide film by a diluted hydrofluoric acid treatment as a pretreatment, the silicon substrate 1 is spin-dried, and introduced into a reactor chamber by way of a pre-chamber of an MBE device under an ultra-high vacuum.

The silicon substrate 1 is heated at a constant temperature, and a K-cell and a shutter are controlled to supply both aluminum and antimony onto the n-type silicon layer 3 on the substrate 1, such that the aluminum antimony projection structure 71 is formed. Then, the gallium antimony layer 72 is deposited by the MBE device to cover the aluminum antimony projection structure 71. Owing to this film formation, the surface is planarized, and a pseudo {110} gallium antimony epitaxial substrate is formed (refer to K. Akahane, N. Yamamoto, S. Gozu, A. Ueta and N. Ohtani, J. Cryst. Growth 264, 21 (2004)).

Furthermore, the strained germanium layer 62 is deposited on the gallium antimony layer 72 by use of the MBE device or CVD apparatus. The lattice of the gallium antimony layer 72 on the silicon substrate is substantially relaxed and indicates a value close to a bulk lattice constant of 0.6096 nm, which is higher than a lattice constant of germanium of 0.5646 nm. Thus, the strained germanium layer 62 is subjected to tensile stress in the face of the substrate, and extended in the direction of the [−111] axis parallel to the face of the substrate.

The band gap of germanium having the tensile structure is about 0.5 eV which is smaller than the band gap of crystalline germanium. Since the band edge has shifted to low energy, a light absorption coefficient in the near-infrared region is significantly enhanced to a level of $10^5$ cm$^{-1}$. When the photoelectric conversion layer of this optical device is photoexcited, a photocurrent is produced.

When an optical signal at a wavelength of 1550 nm modulated at 10 GHz is input to the light receiving element of the present embodiment, an output photocurrent having about the same waveform as that of the input optical signal is obtained. Thus, the light receiving element of the present embodiment enables high-speed and supersensitive optical detection of near-infrared light at a wavelength of 1550 nm having low spectral sensitivity in crystalline germanium.

Next, a light receiving element comprising the above-described photoelectric conversion layer will be explained as a sixth embodiment.

The light receiving element having the FT structure shown in FIG. 8B described above and using horizontally conducting FT-germanium for the photoelectric conversion layer will be described as the sixth embodiment.

In FIG. 8B, a PF-doped FT-germanium photoelectric conversion layer 39 is formed on a host semiconductor formed of germanium, by use of a P-atom as an n-type dopant D substituting for a lattice-point site, and a fluorine atom F as a heteroatom Z inserted in an interstitial site. The concentration of P-F pairs is $5 \times 10^{21}$/cm$^3$. The concentrations of the P-atoms and F-atoms have been confirmed by SIMS.

The checking of the vibration mode intrinsic to the P-F pair is effective to find out whether the P-F pair having the FT structure has been formed in the photoelectric conversion layer 39, and this can be detected by microspectrophotometry of the photoelectric conversion layer. Another method of conveniently checking the formation of the P-F pair comprises: creating a P-F-doped region and a single-P-doped region having the same composition as that of the photoelectric conversion layer on the surface of a highly resistive substrate in addition to the light receiving element according to the present embodiment; and comparing the sheet resistances or carrier densities of these regions. Charge compensation occurs when the P-F pair is formed, so that the P-F-doped region becomes more resistive than the single-P-doped region and decreases in carrier concentration.

The band gap of P-F-doped germanium is substantially equal to that of crystalline germanium. When light having energy equal to or higher than the band gap is applied to this light receiving element to photoexcite P-F-doped germanium of the photoelectric conversion layer, a photocurrent is produced.

FIG. 16 shows the response characteristics of an output photocurrent when an optical signal at a wavelength of 1550 nm modulated at 10 GHz is input to the light receiving element of the present embodiment. As can be understood from FIG. 16, an output photocurrent having about the same waveform as that of the input optical signal is obtained. Thus, the light receiving element of the present embodiment enables high-speed optical detection of near-infrared light at a wavelength of 1550 nm having low spectral sensitivity in crystalline germanium.

As described above, according to the present embodiment, the FT semiconductor which modulates the energy band is significantly effective as a method of increasing the wavelength band of the photoelectric conversion layer of the germanium optical device.

Next, an optical device of a seventh embodiment will be described.

As an example of the optical device of the seventh embodiment, there is provided, on the same substrate, an optical element array having the integration of a light emitting element, an optical device, and a waveguide connecting these components. This optical element array is capable of sending, transmitting and receiving an optical signal.

As shown in FIG. 17, on a silicon substrate 81, there are formed an edge-emitting semiconductor laser element (hereinafter, an LD element) 85 for transmission, and a germanium light receiving element 83 for reception. An oxide film 82 is formed in a region between these elements, on which a Si waveguide 84 for transmission is formed.

The structure shown in FIG. 18 is used for both the LD element 85 and the light receiving element 83. In this light receiving element, an embedded oxide film 2 is formed on a silicon {111} face substrate 1, and an n-type silicon layer 3 converted to n⁺ is formed by ion implantation. One region of the n-type silicon layer 3 is cut and exposed in the form of a trench, on which an n-electrode 8 is formed.

On this n-type silicon layer 3, there are formed a III-V compound semiconductor buffer layer comprising an aluminum antimony projection structure 71 and an (n-layer) gallium antimony (GaSb) layer 72, an (n-layer) indium gallium antimony (InGaSb) layer 73, and a strained germanium layer 62 which is the photoelectric conversion layer. Further, a p-type silicon layer 6 and a p-electrode 7 that are converted to p⁺ are formed on the top of the photoelectric conversion layer 62.

Both the active layer of the LD element 85 and the photoelectric conversion layers of the light receiving element 83 are the strained germanium layers 62. In order to modulate the band structure of the strained germanium layer of the LD element 85 and convert it into a gain medium, InGaSb whose lattice constant is larger than that of GaSb is used in the buffer layer contacting the strained germanium layer to further extend the lattice in the <111> axis direction in the strained germanium layer parallel to the face of the substrate. Owing to this configuration, the strained germanium layer 62 emits light at a wavelength of about 2500 nm, thereby enabling laser oscillation by current injection.

The equivalent InGaSb buffer layer is also used for the light receiving element 83 in order to increase the wavelength of the spectral sensitivity of the light receiving element 83 so that it coincides with the oscillation wavelength of the LD element 85. In addition, in the present embodiment, the In composition of the buffer layer is enhanced in the light receiving element 83 as compared with that in the LD element in order to narrow the band gap of the strained germanium layer to increase the spectral sensitivity of the optical device at the oscillation wavelength.

In the optical element array shown in FIG. 17, an n-electrode 85a and a p-electrode 85b are shown. A trench is dug in the face of the substrate in proximity to the LD element 85, and an edge 88 of the LD element 85 is thus exposed. For the light receiving element 83 as well, an n-electrode 83a and a p-electrode 83b are shown.

In the present embodiment, when an optical signal at a wavelength of 2500 nm modulated at 10 GHz is input to the light receiving element 83 from the LD element 85, an output photocurrent having about the same waveform as that of the input optical signal is obtained in the light receiving element 83. Thus, the light receiving element 83 of the present embodiment enables high-speed and supersensitive optical detection of near-infrared light at a wavelength of 2500 nm showing no spectral sensitivity in crystalline germanium as well.

The embodiments described above have the following characteristics:

(1) The optical device uses, for the photoelectric conversion layer, the tetrahedral bonded semiconductor including germanium atoms as the main component. The lattice constant of the substrate is smaller than that of germanium. The plane direction of the substrate is the {111} face. The semiconductor lattice in the photoelectric conversion layer extends in the direction of the <111> axis vertical to the face of the substrate.

(2) In the optical device described above, the plane direction of the substrate is different from the {111} face, and the {111} face is exposed by the anisotropic etching. The photoelectric conversion layer is formed on this face, such that the semiconductor lattice in the photoelectric conversion layer extends in the direction of the <111> axis.

(3) In the optical device described above, the photoelectric conversion layer is formed of the germanium projection structure. The amorphous silicon film (or the poly silicon, etc) is formed in this layer, and selectively oxidized for the in-plane compression of the germanium projection structure, so that the semiconductor lattice in the germanium projection structure extends in the direction vertical to the face of the substrate.

(4) In the optical device described above, the laminated film producing the in-plane compression stress is partly formed at the top of the photoelectric conversion layer to extend the semiconductor lattice in the germanium projection structure in the direction vertical to the face of the substrate.

(5) In the optical device described above, the lattice constant of the substrate is larger than that of germanium. $L \times A + M \times B + N \times C = 0$ is satisfied where the plane direction of the substrate is set as the (LMN) face and the <111> axis is represented by an <ABC> axis. The <111> axis is included in the direction parallel to the face of the substrate. The semiconductor lattice in the photoelectric conversion layer extends in the direction of the <111> axis.

(6) The optical device according to the embodiments uses, for the photoelectric conversion layer, the tetrahedral bonded semiconductor including germanium atoms as the main components. The optical device includes the n-type dopant D or p-type dopant A substituting for the germanium atom at the lattice-point site of the tetrahedral bonded semiconductor forming the photoelectric conversion layer, and the heteroatom Z inserted in the interstitial site nearest to the above-mentioned dopant. The electron arrangement of the heteroatom Z has a closed-shell structure due to the charge compensation made with the dopant.

Furthermore, the silicon-on-insulator (SOI) substrate is used as the substrate in the present embodiments, but a bulk substrate may be used instead.

According to the embodiments, the length of the bond between germanium atoms is extended or an FT structure is formed in germanium to modulate the band structure, so that the absorption coefficient of the germanium-based photoelectric conversion layer can be increased, thereby making it possible to provide an optical device having higher sensitivity in the long-wavelength band.

What is claimed is:

1. An optical device comprising:
   a substrate whose lattice constant is smaller than that of germanium and which has a plane direction of a {111} face; and
   a photoelectric conversion layer which is disposed on the {111} face of the substrate and which is formed of a tetrahedral bonded semiconductor including germanium atoms as main components so that a semiconductor lattice extends in the direction of a <111> axis vertical to the {111} face.

2. The optical device according to claim 1, wherein the {111} face is exposed onto the main face of the substrate.

3. The optical device according to claim 1, wherein the photoelectric conversion layer comprises a plurality of projections arranged on the {111} face, and an insulator is filled and formed around the projections; and
the insulator is formed by the selective oxidation of a silicon film, and laterally provides in-plane compression to the projections.

4. The optical device according to claim 2, wherein the photoelectric conversion layer comprises a plurality of projections arranged on the {111} face, and an insulator is filled and formed around the projections; and
the insulator is formed by the selective oxidation of a silicon film, and laterally provides in-plane compression to the projections.

5. The optical device according to claim 1, having:
a film producing in-plane compression stress on the photoelectric conversion layer.

6. The optical device according to claim 2, having:
a film producing in-plane compression stress on the photoelectric conversion layer.

7. The optical device according to claim 1, wherein the photoelectric conversion layer comprises a plurality of nanodots arranged on the {111} face, and an insulator is filled and formed around the nanodots; and
the insulator is formed by the selective oxidation of a silicon film, and laterally provides in-plane compression to the nanodots.

8. The optical device according to claim 2, wherein the photoelectric conversion layer comprises a plurality of nanodots arranged on the {111} face, and an insulator is filled and formed around the nanodots; and
the insulator is formed by the selective oxidation of a silicon film, and laterally provides in-plane compression to the nanodots.

9. The optical device according to claim 1, having:
a silicon germanium buffer layer provided between the tetrahedral bonded semiconductor and the {111} face.

10. The optical device according to claim 2, having:
a silicon germanium buffer layer provided between the tetrahedral bonded semiconductor and the {111} face.

11. The optical device according to claim 1, wherein the {111} face corresponds to an inverted-pyramid shaped face.

12. The optical device according to claim 2, wherein the {111} face corresponds to an inverted-pyramid shaped face.

13. The optical device according to claim 2, wherein a plurality of silicon nitride films producing an in-plane compression stress distribution are arranged on the tetrahedral bonded semiconductor including the germanium atoms as the main components.

* * * * *